United States Patent
Gardner et al.

[19]

[11] Patent Number: 6,111,292
[45] Date of Patent: Aug. 29, 2000

[54] SEMICONDUCTOR FABRICATION EMPLOYING SELF-ALIGNED SIDEWALL SPACERS LATERALLY ADJACENT TO A TRANSISTOR GATE

[75] Inventors: Mark I. Gardner, Cedar Creek; Mark C. Gilmer, Austin, both of Tex.

[73] Assignee: Advanced Micro Devices, Inc., Sunnyvale, Calif.

[21] Appl. No.: 09/175,800

[22] Filed: Oct. 20, 1998

Related U.S. Application Data

[62] Division of application No. 08/957,090, Oct. 24, 1997, Pat. No. 5,858,848.

[51] Int. Cl.[7] .................................................. H01L 29/76
[52] U.S. Cl. ........................... 257/344; 257/408; 257/900
[58] Field of Search .................................. 257/344, 408, 257/900

[56] References Cited

U.S. PATENT DOCUMENTS

| | | | |
|---|---|---|---|
| 5,120,668 | 6/1992 | Hsu et al. | 438/301 |
| 5,200,352 | 4/1993 | Pfiester | 437/44 |
| 5,374,574 | 12/1994 | Kwon | 438/291 |
| 5,374,575 | 12/1994 | Kim et al. | 438/291 |
| 5,376,578 | 12/1994 | Hsu et al. | 438/289 |
| 5,434,093 | 7/1995 | Chau et al. | 438/302 |
| 5,436,482 | 7/1995 | Ogoh | 257/344 |
| 5,534,447 | 7/1996 | Hong | 257/344 |
| 5,576,574 | 11/1996 | Hong | 257/408 |
| 5,597,752 | 1/1997 | Niwa | 438/291 |
| 5,858,848 | 1/1999 | Gardner et al. | 438/305 |
| 5,933,738 | 8/1999 | Kao et al. | 438/291 |

*Primary Examiner*—Mark V. Prenty
*Attorney, Agent, or Firm*—Kevin L. Daffer; Conley, Rose & Tayon

[57] ABSTRACT

A method is provided for forming nitride sidewall spacers self-aligned between opposed sidewall surfaces of a gate conductor and a sacrificial dielectric sidewall. In one embodiment, a transistor is formed by first CVD depositing a sacrificial across a semiconductor substrate. An opening is etched through the dielectric to the underlying substrate. A gate oxide is thermally grown across the region of the substrate exposed by the first opening. A polysilicon gate conductor is then formed within the opening upon the gate oxide. Portions of the gate conductor and the gate oxide are removed to expose selective regions of the substrate. In this manner, a pair of opposed sidewall surfaces are defined for the polysilicon gate conductor which are laterally spaced from respective first and second dielectrics. A LDD implant is forwarded into those exposed selective regions of the semiconductor substrate. A dielectric, preferably nitride, is deposited by CVD across the exposed LDD areas of the semiconductor substrate, the sacrificial dielectric, and the gate conductor. The nitride is removed down to a plane level with the upper surface of the gate conductor. The sacrificial dielectric may then be removed from the semiconductor substrate. An ion implantation which is self-aligned to exposed lateral edges of the spacers may then be performed to form heavily doped source/drain regions laterally spaced from the channel.

22 Claims, 6 Drawing Sheets

SEMICONDUCTOR FABRICATION EMPLOYING SELF-ALIGNED SIDEWALL SPACERS LATERALLY ADJACENT TO A TRANSISTOR GATE

This is a Division of application Ser. No. 08/957,090, filed Oct. 24, 1997 now U.S. Pat. No. 5,858,848.

BACKGROUND OF THE INVENTION

1. Field of the Invention

This invention relates to integrated circuit fabrication and, more particularly, to using a selective deposition to form sidewall spacers in a self-aligned manner laterally adjacent to opposed sidewall surfaces of a transistor gate conductor.

2. Description of the Relevant Art

Fabrication of a MOSFET device is well known. Generally speaking, MOSFETs are manufactured by placing an undoped polycrystalline ("polysilicon") material over a relatively thin gate oxide. The polysilicon material and the gate oxide are then patterned to form a gate conductor with source/drain regions adjacent to and on opposite sides of the gate conductor. The gate conductor and source/drain regions are then implanted with an impurity dopant species. If the impurity dopant species used for forming the source/drain regions is n-type, then the resulting MOSFET is an NMOSFET ("n-channel") transistor device. Conversely, if the source/drain dopant species is p-type, then the resulting MOSFET is a PMOSFET ("p-channel") transistor device. Integrated circuits utilize either n-channel devices exclusively, p-channel devices exclusively, or a combination of both on a single substrate. While both types of devices can be formed, the devices are distinguishable based on the dopant species used.

Operating transistors which have heavily doped source/drain regions arranged directly adjacent the gate conductor often experience a problem known as hot carrier injection ("HCI"). HCI is a phenomena by which the kinetic energy of the charged carriers (holes or electrons) is increased as they are accelerated through large potential gradients, causing the charged carriers to become injected into and trapped within the gate oxide. The greatest potential gradient, often referred to as the maximum electric field ("Em") occurs near the drain during saturated operation. As a result of carrier entrapment within the gate oxide, a net negative charge density forms in the gate oxide. The trapped charge can accumulate with time, resulting in a positive threshold shift in a NMOS transistor, or a negative threshold shift in a PMOS transistor.

To overcome problems of sub-threshold current and threshold shift resulting from HCI, an alternative drain structure known as the lightly doped drain ("LDD") is commonly used. The purpose of the LDD is to absorb some of the potential into the drain and thus reduce Em. A conventional LDD structure is one in which a light concentration of dopant is self-aligned to the gate conductor followed by a heavier dopant self-aligned to the gate conductor on which two sidewall spacers have been formed. The purpose of the first implant dose is to produce a lightly doped section within the active area (hereinafter "junction") at the gate edge near the channel. The second implant dose is spaced from the channel a distance dictated by the thickness of the sidewall spacer. The second implant dose forms a heavily doped source/drain region within the junction laterally outside the LDD area. In this manner, the lateral thickness of the sidewall spacers dictates the length of the LDD areas.

Unfortunately, the addition of LDD areas adjacent the channel adds parasitic resistance to the source/drain pathway, leading to many deleterious effects. For example, the parasitic resistance causes an increase in the value of the gate-to-source voltage, $V_{GS}$, required for the drive current, $I_D$, (i.e., current flowing between the source and drain regions of the transistor) to reach saturation. Reducing the parasitic resistances associated with the source and drain regions would help inhibit these deleterious effects; however, decreasing the drain parasitic resistance, $R_D$, is not viable since HCI prevention is necessary. Thus, the source-side and drain-side LDD lengths must be properly controlled to ensure that source-side parasitic resistance, $R_S$, is minimized while at the same time attenuating Em at the drain-side of the channel. If the lateral thickness of the drain-side sidewall spacer is too small, then the corresponding LDD length might not sufficiently suppress HCI. Yet, if the source-side spacer is too large, then $R_S$ may unduly jeopardize transistor operation. It may thus be desirable to form a transistor such that the source-side LDD length is smaller than the drain-side LDD length.

In order to form LDD areas of varying lengths for a transistor, several steps must be employed. First, an LDD implant self-aligned to the sidewall surfaces of a gate conductor is forwarded into a semiconductor substrate. A first spacer material is deposited across the substrate and the gate conductor. The first spacer material is anisotropically etched to form a first spacer layer upon each of the sidewall surfaces of the gate conductor. A masking layer is then formed across one of the first spacer layers and the LDD area adjacent that first spacer layer. A source/drain implant self-aligned to the exposed lateral edge of the unmasked first spacer layer is forwarded into exposed regions of the substrate. The masking layer is removed, and a second spacer material is deposited and etched to form a second spacer layer upon the first spacer layer. Another source/drain implant self-aligned to the exposed lateral edge of the second spacer layer is forwarded into the substrate. The resulting transistor includes one LDD area, preferably the source-side LDD area, having a length approximately equal to the lateral thickness of the first spacer layer. It also includes another LDD area, preferably the drain-side LDD area, having a length approximately equal to the combined lateral thicknesses of the first and second spacer layers. Alternately, an asymmetrical transistor may be formed having only a drain-side LDD area by aligning the source implant to a sidewall surface of the gate conductor and aligning the drain implant to the lateral edge of a sidewall spacer formed as described above.

Figure 1:
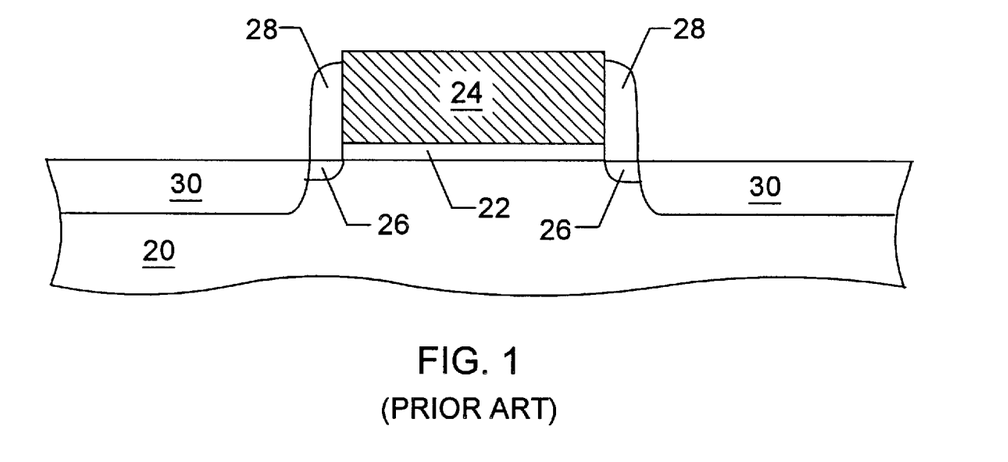
FIG. 1 is a cross-sectional view of a semiconductor topography, wherein sidewall spacers have been formed upon opposed sidewall surfaces of a transistor gate conductor, according to conventional design.

A transistor employing sidewall spacers formed using a conventional technique is depicted in FIG. 1. A gate conductor 24 is spaced above a semiconductor substrate 20 by a gate oxide 22. Oxide sidewall spacers 28 are arranged upon the opposed sidewall spacers of gate conductor 24. LDD areas 26 are disposed within substrate 20 directly underneath sidewall spacers 28. Source/drain regions 30 are arranged within substrate 20 laterally adjacent LDD areas 26. The peak of each of the oxide sidewall spacers 28 is shown as being positioned at a level below the upper surface of gate conductor 24. This positioning of the sidewall spacer peak may occur as a result of using anisotropic etching to define oxide spacers 26. Ion bombardment during anisotropic etching occurs more frequently upon vertical surfaces than horizontal surfaces of the material being removed. Thus, during the formation of oxide sidewall spacers 28, after oxide upon the upper surface of gate conductor 24 has been completely removed, a lateral thickness of oxide remains upon the sidewall surfaces of the gate conductor. If this lateral thickness of oxide is greater than that of the desired lateral thickness of sidewall spacers 28, the anisotropic etch duration is typically extended until the desired spacer thickness is reached. The type of anisotropic etch employed may exhibit a high selectivity to oxide, thereby preventing removal of substrate 20 and gate conductor 24 which comprise silicon. Unfortunately, a substantial portion of the upper portion of sidewall spacers 28 may be removed, resulting in the arrangement of the oxide spacers depicted in FIG. 1.

Integrated circuit formation involves electrical linkage of various active devices, i.e., transistors. Contacts are formed through an interlevel dielectric to the electrically active areas, and multiple levels of dielectrically isolated interconnect are routed to the contacts. Formation of a contact coupled to the gate conductor involves etching an opening vertically through an interlevel dielectric down to the gate conductor using a conventional optical lithography technique and an etch technique highly selective to the interlevel dielectric material. Unfortunately, misalignment of the photoresist masking layer may occur during optical lithography, causing the contact opening to form such that it extends down to the peak of one of the oxide sidewall spacers. Further, this misalignment of the masking layer may permit ion bombardment of that oxide sidewall spacer during the, e.g., etch of an oxide-based interlevel dielectric. As a result, the contact opening may extend well below the surface of the gate conductor. Thus, when a conductive material, such as tungsten is deposited into the contact opening, it may become arranged laterally adjacent to the gate conductor in regions where the sidewall spacer has been removed. This configuration of the conductive material may provide for unwanted capacitive coupling or electrical linkage between the gate conductor and the source/drain regions.

It would therefore be desirable to devise a method for forming a sidewall spacer to a desired lateral thickness without the peak of the spacer being removed to a level below the surface of the adjacent gate conductor. The sidewall spacer must effectively prevent electrical shorting between the gate conductor and adjacent junction. Thus, it would also be beneficial to form sidewall spacers which are substantially resistant to attack by etchants which are highly selective to oxide. Further, it would be desirable to develop a technique for efficiently forming a transistor having different source-side and drain-side LDD lengths using substantially fewer steps. Since the lateral thicknesses of the sidewall spacers employed by a transistor determines the LDD lengths, effectively controlling spacer thickness is important.

SUMMARY OF THE INVENTION

The problems outlined above are in large part solved by the technique hereof for fabricating a transistor having silicon nitride ("nitride") sidewall spacers self-aligned laterally adjacent to the opposed sidewall surfaces of the gate conductor. More particularly, formation of the sidewall spacers involves chemical vapor deposition ("CVD") of nitride across a pair of selective regions of a semiconductor substrate. Openings extending vertically to the semiconductor substrate expose those selective regions prior to deposition of the nitride. Each opening is arranged laterally between a sacrificial dielectric and a sidewall surface of the ensuing gate conductor. The openings are formed by etching away portions of the gate conductor material not covered by a masking photoresist layer patterned above the gate conductor material and the sacrificial dielectric. The lateral thickness of each sidewall spacer is dictated by the width of its corresponding opening.

The nitride may be deposited into the openings upon the selective regions of the substrate and across the sacrificial dielectric and the gate conductor. The nitride may then be removed down to a level commensurate with that of the upper surface of the gate conductor using, e.g., a chemical-mechanical polish ("CMP"). The upper surfaces of the resulting sidewall spacers lie in the same horizontal plane as the upper surface of the gate conductor. The presence of the sidewall spacers directly adjacent to the opposed sidewall surfaces of the gate conductor lowers the possibility of conductive material becoming arranged laterally adjacent to the gate conductor. Thus, an electrical short forming between the gate conductor and an adjacent junction is less likely.

Prior to formation of the sidewall spacers, an LDD implant is forwarded into regions of the substrate exposed by the openings. Once the sidewall spacers have been formed adjacent the sidewall surfaces of the ensuing gate conductor, the sacrificial dielectric is removed and a source/drain implant self-aligned to the exposed lateral edges of the spacers is forwarded into the substrate. The lengths of the LDD areas underneath the sidewall spacers are dictated by the lateral thicknesses of the overlying spacers. Advantageously, only one spacer layer is required to form source-side and drain-side LDD areas which have different lengths. Sidewall spacers of varying lateral thickness may be defined by using a single selective deposition of nitride followed by removal of the excess nitride. Since the nitride is deposited into the openings, the lateral dimensions of the openings determine the lateral thicknesses of the spacers. Optical lithography is used to pattern a photoresist masking layer which dictates the size of the openings. The pattern of the resist masking layer can be pre-selected so as to control the thickness of the spacers. Thus, the lateral thickness of the drain-side spacer may be made larger than that of the source-side spacer, resulting in LDD lengths which minimize HCI and $R_S$. In fact, a transistor which contains no source-side LDD may be formed in relatively few steps when desired.

In one embodiment, a transistor is formed by first CVD depositing a sacrificial dielectric, e.g., oxide across a semiconductor substrate. A first opening is then etched through the dielectric to the underlying substrate, separating the dielectric into a first dielectric and a second dielectric. A gate oxide is thermally grown across the region of the substrate exposed by the first opening. Polysilicon is then deposited across the exposed surfaces of the gate oxide and the sacrificial dielectric to a level spaced above the dielectric surface. The polysilicon is removed down to a level approximately commensurate with the surface of the sacrificial dielectric such that the polysilicon is arranged upon the gate oxide exclusively within the first opening. Portions of the polysilicon and the gate oxide are then removed using optical lithography to define a pair of opposed sidewall surfaces of a polysilicon gate conductor. The opposed sidewall surfaces of the resulting gate conductor are laterally spaced from respective first and second dielectrics. Second and third openings arranged between the gate conductor and the sacrificial dielectric thus expose selective regions of the semiconductor substrate.

A relatively light dopant concentration is implanted into those exposed selective regions of the semiconductor substrate not covered by the masking gate conductor and the sacrificial dielectric. In this manner, LDD areas are formed within the semiconductor substrate self-aligned between the sidewall surfaces of the gate conductor and the first and second dielectrics. Subsequently, a dielectric, preferably nitride, is deposited by CVD across the exposed LDD areas of the semiconductor substrate, the sacrificial dielectric, and the gate conductor. The nitride is then removed down to a plane level with the upper surface of the gate conductor using, e.g., CMP. The sacrificial dielectric may then be removed from the semiconductor substrate. An ion implantation which is self-aligned to exposed lateral edges of the spacers may then be performed to form heavily doped source/drain regions laterally spaced from the channel.

An oxide interlevel dielectric may then be CVD deposited across the resulting transistor and semiconductor substrate. A contact opening may be etched through the interlevel dielectric down to the gate conductor or to a source/drain junction. An etch technique which is highly selective to oxide may be used to form the contact opening. Thus, even if the photoresist masking layer formed above the interlevel dielectric is mis-aligned such that regions of the interlevel dielectric directly above the nitride spacers are exposed, deleterious removal of the spacers is prevented. A conductive material, e.g., tungsten or titanium may be deposited into the contact opening to form a contact to the transistor which may be subsequently coupled to, e.g., a local interconnect. The presence of the nitride spacers prevent conductive material from being deposited in regions directly laterally adjacent to the gate conductor where they could render the transistor inoperable.

BRIEF DESCRIPTION OF THE DRAWINGS

Other objects and advantages of the invention will become apparent upon reading the following detailed description and upon reference to the accompanying drawings in which.

DETAILED DESCRIPTION OF THE INVENTION

Figure 2:
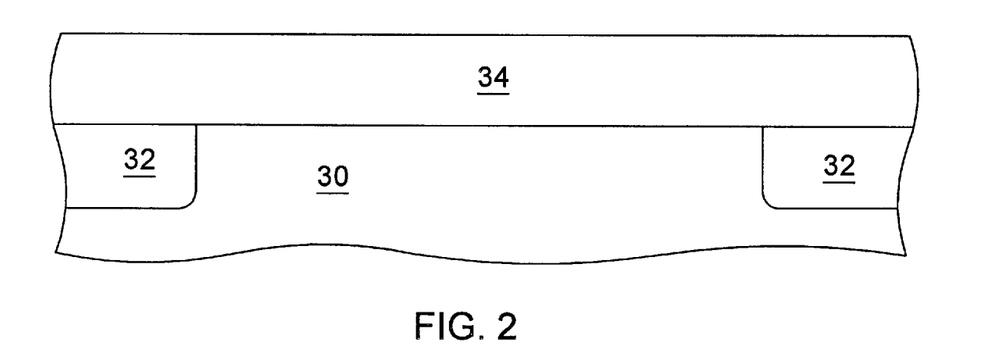
FIG. 2 is a cross-sectional view of a semiconductor topography, wherein a sacrificial dielectric is deposited across a semiconductor substrate.
Figure 3:
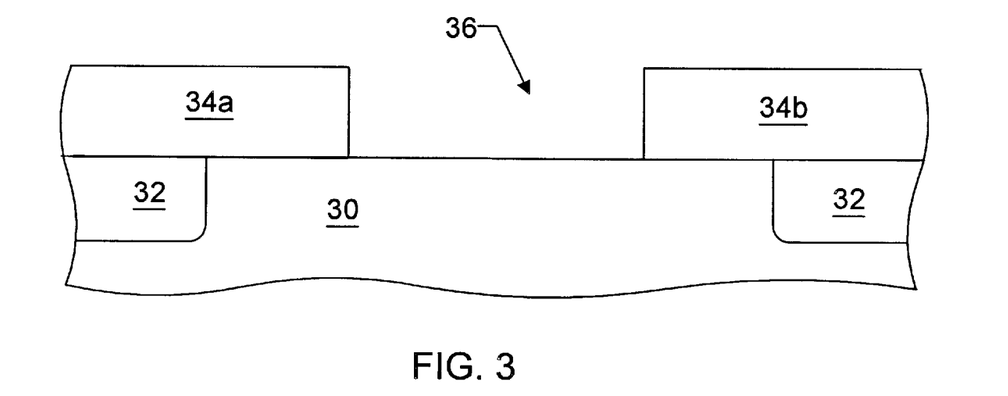
FIG. 3 is a cross-sectional view of the semiconductor topography, wherein an opening is formed through the dielectric to expose a region of the semiconductor substrate, subsequent to the step in FIG. 2.

Turning now to the drawings, FIG. 2 illustrates a semiconductor substrate 30 across which oxide is deposited from, e.g., a silane and oxygen containing plasma to form a sacrificial dielectric 34. Substrate 30 may comprise single crystalline silicon and dielectric isolation regions, such as trench isolation structures 32 which are arranged a spaced distance apart within substrate 30 for dielectrically isolating ensuing active areas. Turning to FIG. 3, a portion of sacrificial dielectric 34 may be removed using optical lithography followed by, e.g., a dry, plasma etch technique which is terminated before substantial portions of substrate 30 can be removed. As a result, an opening 36 is formed vertically through sacrificial dielectric 34, severing the dielectric into a first dielectric 34a and a second dielectric 34b.

Figure 4:
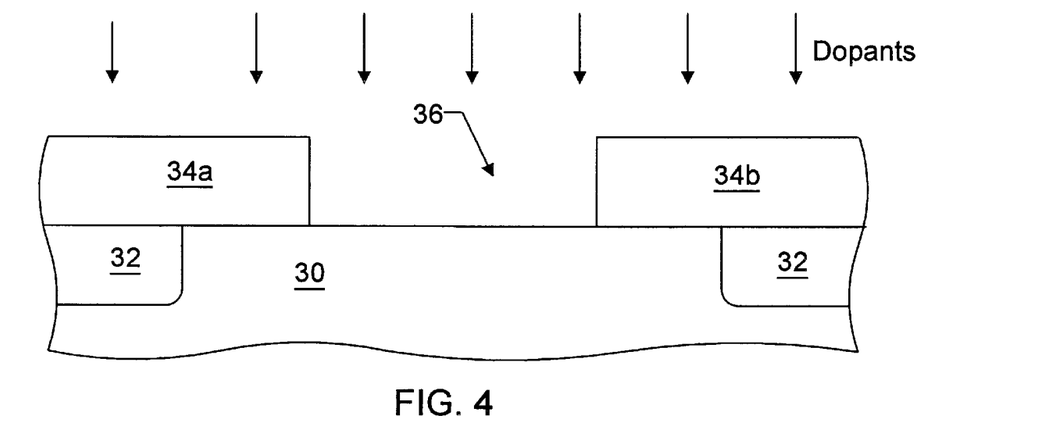
FIG. 4 is a cross-sectional view of the semiconductor topography, wherein channel dopants are introduced into the exposed semiconductor substrate, subsequent to the step in FIG. 3.

FIG. 4 depicts dopants being implanted into the exposed region of substrate 30. The dopants are implanted to a relatively shallow depth below the substrate surface within an ensuing channel region. The dopant dose is pre-selected in order to adjust the threshold voltage of the ensuing transistor. In order to provide for maximum current-driving capability, the threshold voltages should be minimized, with the minimum voltage value being dictated by the need to prevent excessive subthreshold currents from developing. If the ensuing transistor is to belong to a CMOS integrated circuit, dopants which are opposite in type to that of the bulk substrate may also be implanted into the exposed region of substrate 30 prior to the depicted threshold adjust implant so as to form a well therein. Well formation is only necessary if the majority carrier of the bulk substrate 30 is opposite to that required by the channel region of the ensuing transistor. For example, an NMOSFET device requires the majority charge carrier of the channel region to be p-type while an n-type majority charge carrier is required for the channel region of a PMOSFET device. Yet further, an additional punchthrough prevention implant may be forwarded into the exposed region of substrate 30 subsequent to the threshold adjust implant depicted in FIG. 4. The additional implant is used to inhibit punchthrough without the need to raise the dopant concentration of the entire substrate.

Figure 5:
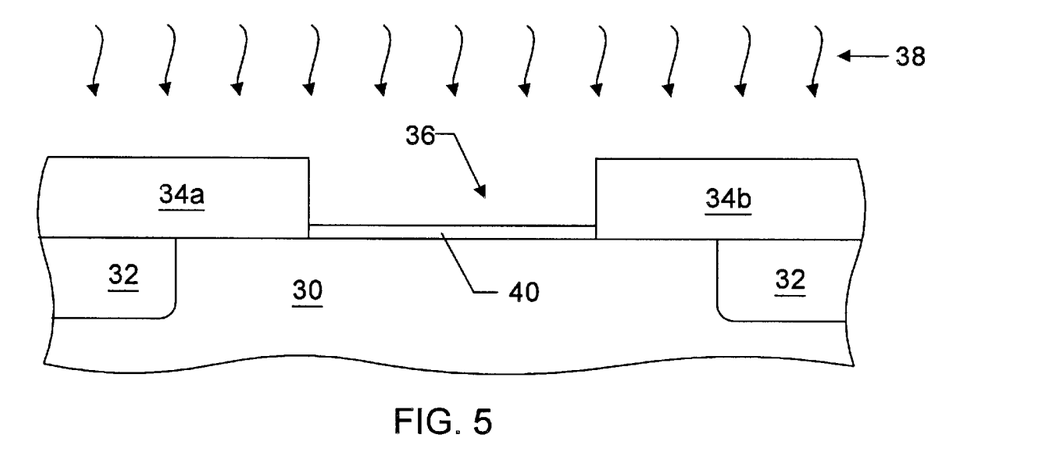
FIG. 5 is a cross-sectional view of the semiconductor topography, wherein a gate oxide is thermally grown across the exposed region of the substrate, subsequent to the step in FIG. 4.
Figure 6:
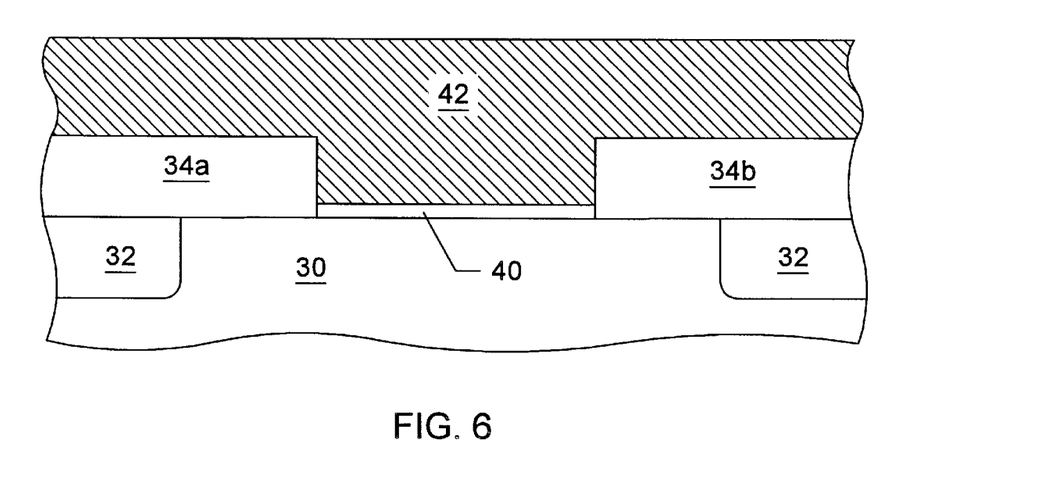
FIG. 6 is a cross-sectional view of the semiconductor topography, wherein polysilicon is deposited across the gate oxide and the sacrificial dielectric, subsequent to the step in FIG. 5.
Figure 7:
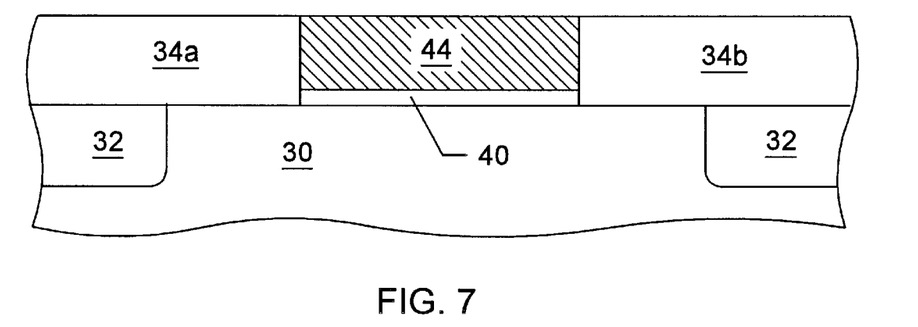
FIG. 7 is a cross-sectional view of the semiconductor topography, wherein the polysilicon is removed down to a level equivalent to the upper surface of the sacrificial dielectric, subsequent to the step in FIG. 6.
Figure 8:
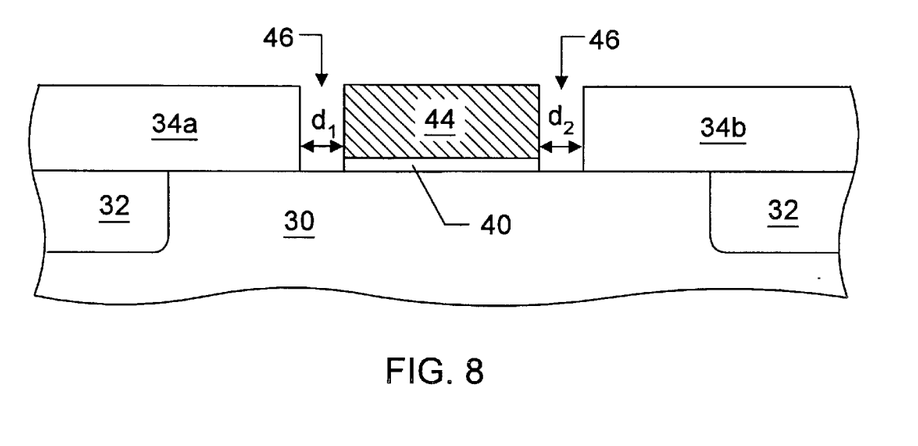
FIG. 8 is a cross-sectional view of the semiconductor topography, wherein portions of the polysilicon and the gate oxide are removed to define opposed sidewall surfaces of a polysilicon gate conductor spaced laterally form the sacrificial dielectric, subsequent to the step in FIG. 7.

Turning to FIG. 5, a gate dielectric 40 comprising, e.g., oxide may be thermally grown exclusively across substrate 30 by subjecting the substrate to thermal radiation 38 at a temperature of greater than about 700° C. while in an oxygen bearing ambient. As shown in FIG. 6, polysilicon 42 may then be CVD deposited from, e.g., a silane source across gate dielectric 40 and sacrificial dielectric 34. FIG. 7 illustrates the removal of polysilicon 42 down to the upper surface of sacrificial dielectric 34, thereby defining a pair of opposed sidewall surfaces for a polysilicon gate conductor 44. Removal of polysilicon 42 is preferably achieved using CMP such that the resulting surface of gate conductor 44 is substantially free of surface irregularities and is relatively planar. Thereafter, portions of gate conductor 44 and gate dielectric 40 may be etched away to form openings 46 arranged laterally between opposed sidewall surfaces of the ensuing gate conductor and respective first and second dielectrics 34a and 34b, as illustrated in FIG. 8. Optical lithography may be used to define a photoresist masking layer across the surface of the semiconductor topography exclusive of those portions. Those portions may undergo removal by, e.g., a dry, plasma etch. Etch duration is selected to terminate before substantial portions of substrate 30 are removed. Depending on the pattern design used to define the resist masking layer, the lateral length $d_1$ of the source-side opening may or may not be dissimilar from the lateral length $d_2$ of the drain-side opening.

Figure 9:
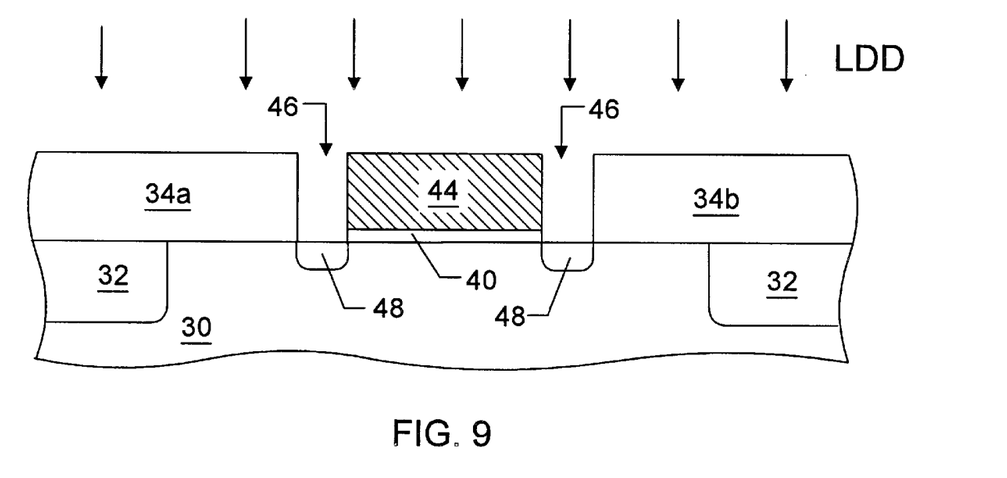
FIG. 9 is a cross-sectional view of the semiconductor topography, wherein an LDD implant which is self-aligned to the sidewall surfaces of the gate conductor is forwarded to the substrate, subsequent to the step in FIG. 8.
Figure 10:
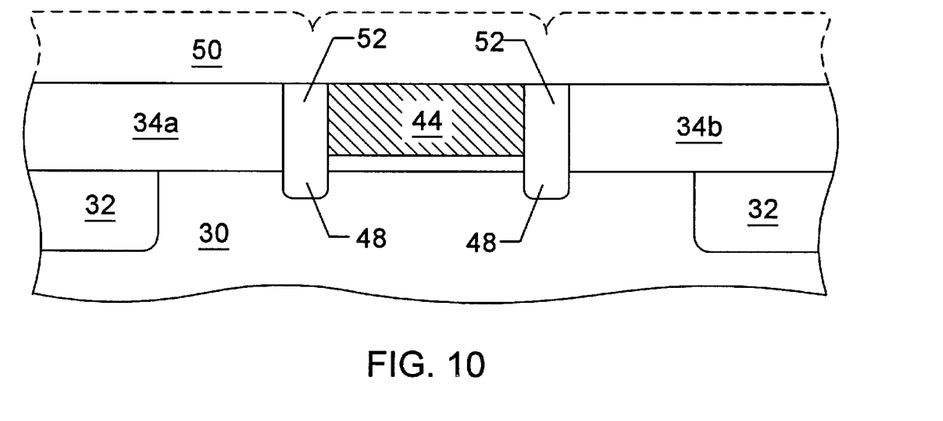
FIG. 10 is a cross-sectional view of the semiconductor topography, wherein nitride sidewall spacers are formed between the sidewall surfaces of the gate conductor and the sacrificial dielectric, subsequent to the step in FIG. 9.

As shown in FIG. 9, an LDD implant may then be forwarded to the exposed regions of semiconductor substrate 30. The LDD implant is aligned between the opposed sidewall surfaces of gate conductor 44 and respective first and second dielectrics 34a and 34b. As a result, LDD areas 48 are formed within regions of substrate 30 arranged in alignment beneath openings 46. The LDD areas 48 preferably contain a light concentration of dopants that are opposite in type to the dopants implanted within the channel region of substrate 30. FIG. 10 illustrates the formation of sidewall spacers 52 laterally adjacent to the opposed sidewall surfaces of gate conductor 44. Sidewall spacers 52 may be formed by first CVD depositing a high quality nitride from, e.g., a high density plasma (i.e., plasma having more than approximately $10^{10}$ ions/cm$^3$) containing silane and nitrogen. In this manner the nitride is arranged across selective portions of substrate 30 defined by openings 46 and across first and second dielectrics 34a and 34b. A portion 50 of the nitride may be removed using, e.g., a CMP polish such that the upper surfaces of the resulting sidewall spacers 52 extend across a horizontal plane level with the upper surface of gate conductor 44. The sidewall spacers 52 may have different lateral thicknesses, depending on the lateral lengths of openings 46 (see FIG. 9). The lateral thickness of the source-side spacer is approximately equivalent to $d_1$, and the lateral thickness of the drain-side spacer is approximately equivalent to $d_2$.

Figure 11:
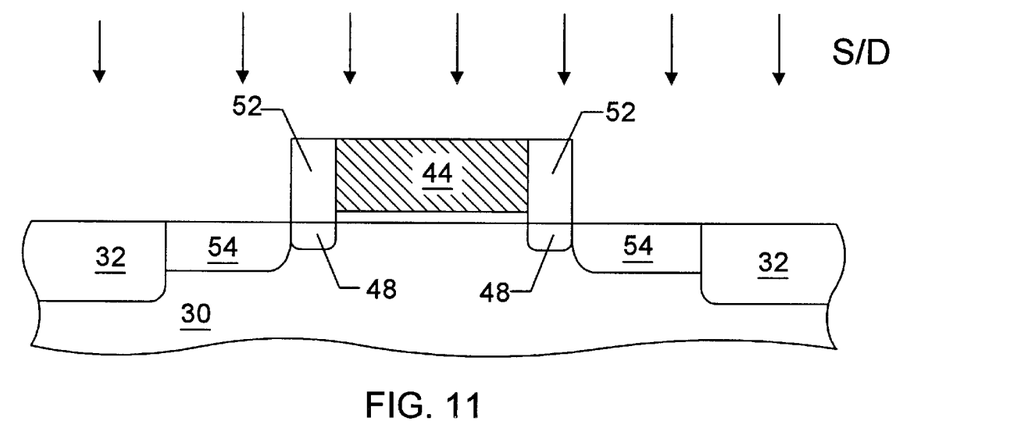
FIG. 11 is a cross-sectional view of the semiconductor topography, wherein the sacrificial dielectric is removed and a source/drain implant which is self-aligned to the exposed lateral edges of the sidewall spacers is forwarded to the substrate, subsequent to the step in FIG. 10.
Figure 12:
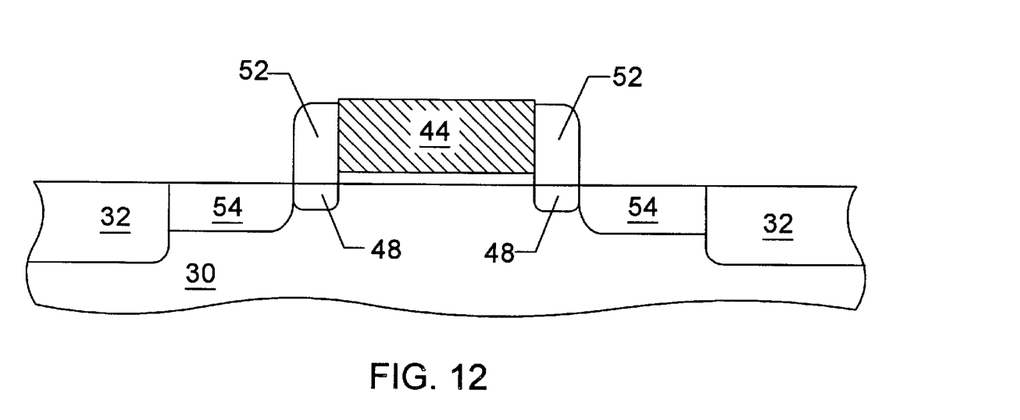
FIG. 12 is a cross-sectional view of the semiconductor topography, wherein the sidewall spacers are isotropically etched to substantially round the exposed corners of the spacers, subsequent to the step in FIG. 11.

As shown in FIG. 11, first and second sacrificial dielectrics 34a and 34b may then be removed from substrate 30 using, e.g., an etch technique which exhibits high selectivity for oxide. A heavy concentration source/drain (S/D) implant is then self-aligned to the exposed lateral surfaces of nitride spacers 52. During this implantation step, dopants are also forwarded into gate conductor 44, increasing the conductivity of the gate conductor. The dopants used for the S/D implant are of the same type as those used for the LDD implant. Preferably, if a PMOSFET transistor is being formed, ion implantation of p-type species is performed. On the other hand, if an NMOSFET transistor is being formed, n-type species are implanted into substrate 30. Some commonly used n-type dopants are arsenic or phosphorus, and some commonly used p-type dopants are boron or boron difluoride. The resulting transistor has graded junctions in which dopant concentration increases laterally in a direction away from gate conductor 44 and terminates at isolation structures 32. In other words, source/drain regions 54 are formed within semiconductor substrate 30 which are more heavily concentrated with dopants than LDD areas 48. The length of each LDD area 48 is equivalent to the thickness of the overlying spacer, and thus may vary from drain-side to source-side LDD. As illustrated in FIG. 12, an isotropic etch, e.g., a wet etch highly selective to nitride may be used to remove a minute portion of sidewall spacers 52. Since isotropic etch occurs at the same rate in all directions, the exposed corners of sidewall spacers 52 are thus made substantially round. Rounding of the corners of sidewall spacers 52 is beneficial in that it provides for better step coverage of materials subsequently formed across the spacers. It is well known that step coverage of overlying films is better when the slope of the step is less vertical.

Figure 13:
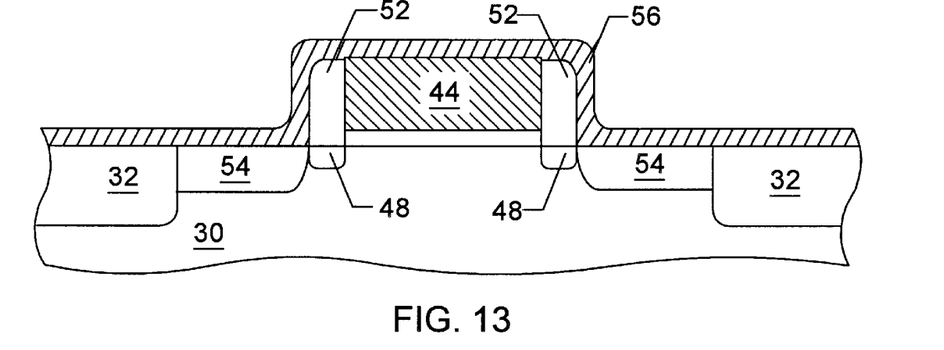
FIG. 13 is a cross-sectional view of the semiconductor topography, wherein a refractory metal is deposited across exposed surfaces of the topography, subsequent to the step in FIG. 12.
Figure 14:
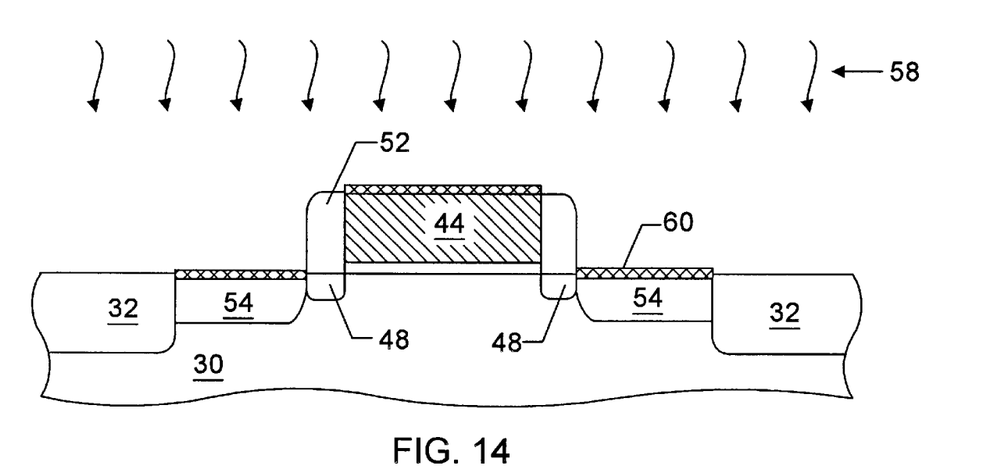
FIG. 14 is a cross-sectional view of the semiconductor topography, wherein a metal salicide is formed upon the gate conductor and the source/drain regions of the substrate, subsequent to the step in FIG. 13.

Turning to FIG. 13, a refractory metal 56, e.g., titanium or cobalt, may be formed across exposed surfaces of gate conductor 44, nitride sidewall spacers 52, and substrate 30. Refractory metal 56 may be sputter deposited from a metal target or MOCVD ("metal organic" CVD) deposited from a source comprising a volatile metal organic compound. Turning to FIG. 14, a metal salicide 60 (self-aligned silicide) may then be formed exclusively upon exposed regions of substrate 30 and gate conductor 44. Metal salicide 60 may be formed by exposing refractory metal 56 to a form of radiation 58 capable of increasing the temperature of the refractory metal. Radiation 58 may be thermal radiation provided from a heated furnace. Alternately, radiation 58 may be radiant light supplied from, e.g., an arc lamp or a tungsten-halogen lamp using a technique known as rapid thermal processing ("RTP"). The use of RTP to heat refractory metal 56 may reduce the amount of unwanted dopant diffusion into the semiconductor topography as compared to using a high temperature furnace. Raising the temperature of refractory metal 56 serves to initiate reaction between metal atoms and silicon atoms of polysilicon gate conductor 44 and substrate 30. Any unreacted refractory metal which remains may be etched away using, e.g., a wet etch highly selective to the metal. The resulting metal salicide 60 has a relatively low resistivity and serves as a self-aligned contact region across source/drain regions 54 and gate conductor 44.

Figure 15:
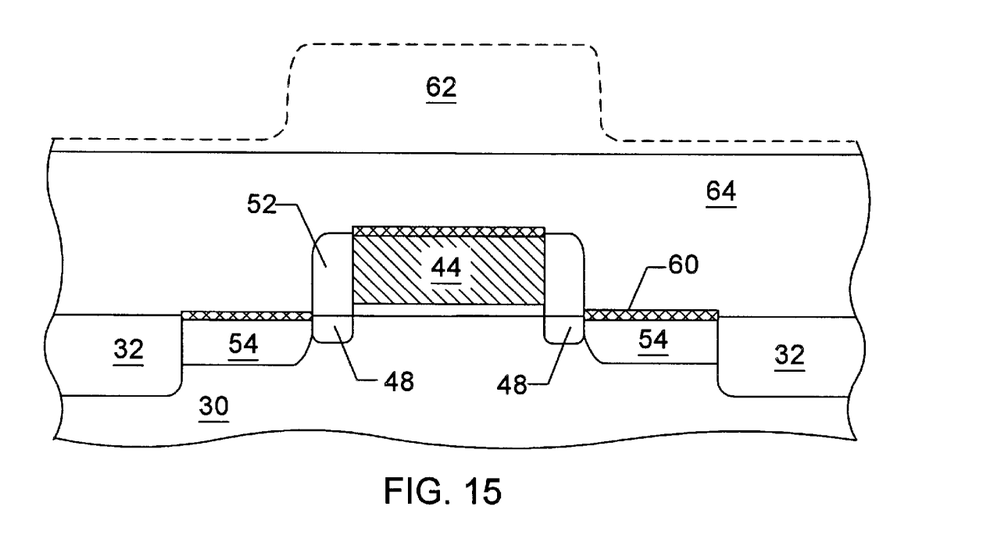
FIG. 15 is a cross-sectional view of the semiconductor topography, wherein an interlevel dielectric having a relatively planar surface is formed across the exposed surfaces of the topography, subsequent to the step in FIG. 14.
Figure 16:
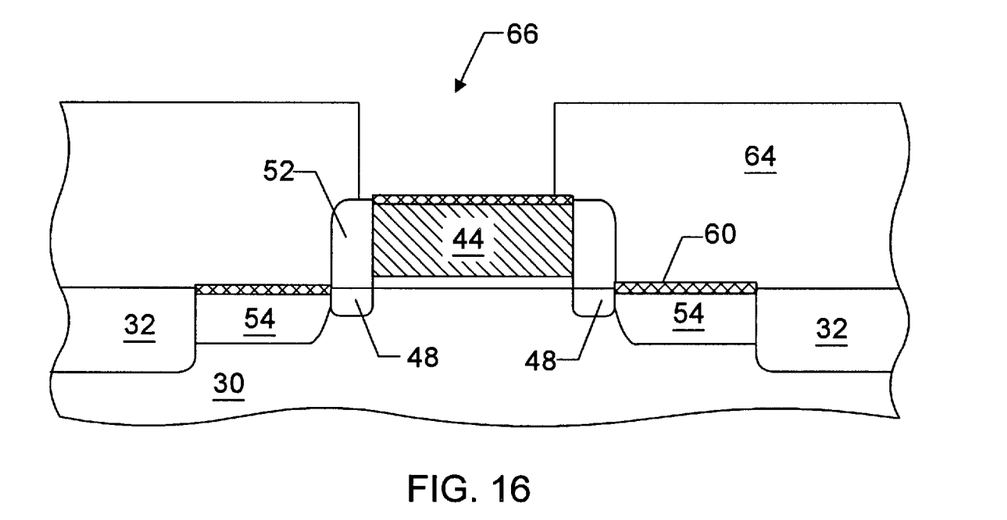
FIG. 16 is a cross-sectional view of the semiconductor topography, wherein a slightly mis-aligned contact opening is shown etched down to the gate conductor and one of the nitride sidewall spacers, subsequent to the step in FIG. 15.

FIG. 15 depicts oxide being CVD deposited across exposed surfaces of the semiconductor topography. A portion 62 of the oxide may be removed using, e.g., CMP to form an interlevel dielectric 64 having a substantially planar surface. FIG. 16 depicts the formation of a contact opening 66 through interlevel dielectric 64 such that the metal salicide 60 disposed across gate conductor 44 is exposed. A portion of interlevel dielectric 64 may be etched away to form contact opening 66 using e.g., an etch technique which is highly selective to the oxide. Although not intentional, opening 66 may unfortunately be slightly mis-aligned to allow a portion of one of the nitride sidewall spacers 52 to be exposed adjacent metal salicide 60. Fortunately, since sidewall spacers 52 are composed of nitride, the etchant used to remove oxide-based interlevel dielectric 64 does not substantially attack the nitride-based spacers.

Figure 17:
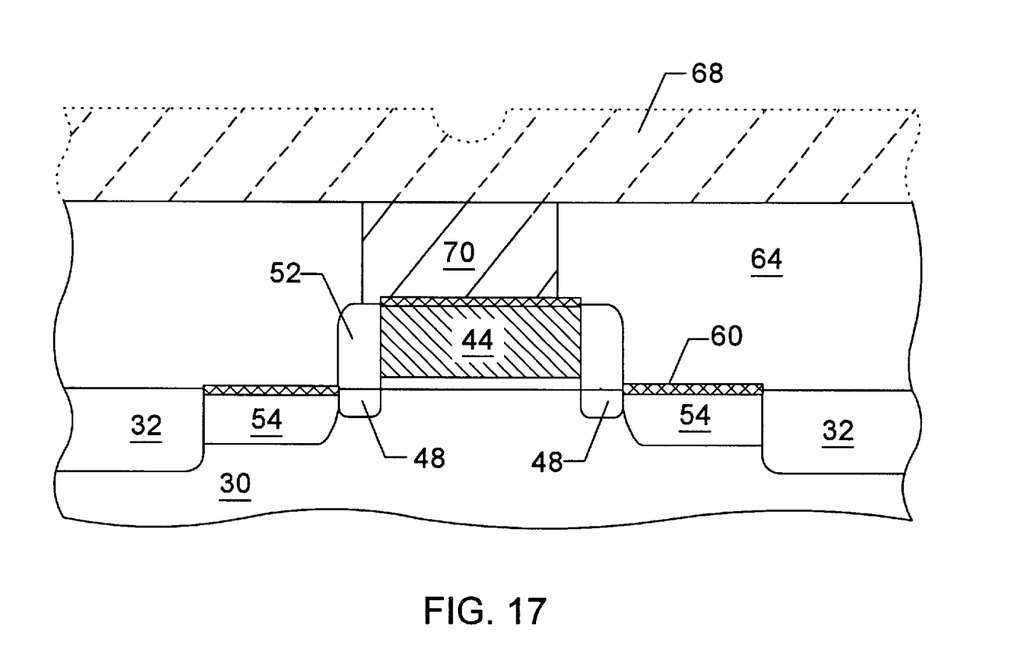
FIG. 17 is a cross-sectional view of the semiconductor topography, wherein a conductive contact is formed within the contact opening, subsequent to the step in FIG. 16.

FIG. 17 depicts the formation of a conductive contact 70 within the contact opening. A conductive material, such as tungsten or titanium may be sputter deposited or MOCVD deposited into the contact opening and across interlevel dielectric 64. A portion 68 of the conductive material may then be removed down to a level commensurate with the upper surface of interlevel dielectric 64. As a result, the upper surface of contact 70 is even with that of the interlevel dielectric. A local interconnect comprising e.g., polysilicon may subsequently be formed across interlevel dielectric 64 such that it is coupled to contact 70. Alternately, portion 68 of the conductive material may be allowed to remain above interlevel dielectric 64 to serve both as a contact and a local interconnect. The presence of nitride sidewall spacers 52 advantageously prohibits contact 70 from extending into the region directly adjacent to the sidewall surfaces of gate conductor 44, thereby reducing the possibility of a conductive path deleteriously forming between gate conductor 44 and the adjacent junctions.

It will be appreciated to those skilled in the art having the benefit of this disclosure that this invention is believed to provide a method for forming self-aligned sidewall spacers laterally between sidewall surfaces of a transistor gate conductor and a sacrificial dielectric sidewall. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A transistor, comprising:
    a gate conductor arranged above a semiconductor substrate between a pair of opposed sidewall surfaces;
    first and second spacers arranged between said pair of opposed sidewall surfaces and respective first and second sacrificial dielectrics, wherein both of said spacers comprise nitride, and wherein said first spacer is adjacent to said first sacrificial dielectric and said second spacer is adjacent to said second sacrificial dielectric, and wherein upper surfaces of said first and second spacers are substantially planar and substantially coplanar with an uppermost surface of said gate conductor and uppermost surfaces of said first and second sacrificial dielectrics; and
    lightly doped drain areas arranged within said semiconductor substrate and beneath said first and second spacers.

2. The transistor of claim 1 wherein said lightly doped drain areas are arranged directly below said spacers such that each of said lightly doped drain areas comprises a lateral thickness approximately equal to a lateral thickness of the spacer directly above.

3. The transistor of claim 2, wherein said first spacer comprises a first lateral thickness, and wherein said second spacer comprises a second lateral thickness, and wherein said first lateral thickness and said second lateral thickness are dissimilar.

4. The transistor of claim 3, wherein said second lateral thickness is greater than said first lateral thickness.

5. A transistor, comprising:
    first and second sacrificial dielectrics arranged upon a semiconductor substrate;
    a gate conductor arranged between said first and second sacrificial dielectrics, wherein a source-side opening is defined between said gate conductor and said first sacrificial dielectric, and wherein a drain-side opening is defined between said gate conductor and said second sacrificial dielectric, and wherein a lateral thickness of said drain-side opening is greater than a lateral thickness of said source-side opening;
    a plurality of lightly doped drain areas arranged within said substrate, wherein one of said plurality of lightly doped drain areas is aligned between lateral boundaries of said source-side opening and another of said plurality of lightly doped drain areas is aligned between lateral boundaries of said drain-side opening; and
    a first spacer arranged within said source-side opening and a second spacer arranged within said drain-side opening, wherein upper surfaces of said first and second spacers are substantially planar and substantially coplanar with an uppermost surface of said gate conductor and uppermost surfaces of said sacrificial dielectrics.

6. The transistor of claim 5, wherein both said first spacer and said second spacer comprise nitride.

7. The transistor of claim 6, wherein both said first sacrificial dielectric and said second sacrificial dielectric comprise oxide.

8. The transistor of claim 5, wherein said first and second spacers are each upon and in contact with one of said plurality of lightly doped drain areas.

9. A transistor, comprising:
    a gate conductor arranged above a semiconductor substrate between a pair of opposed sidewall surfaces;
    first and second spacers arranged between said pair of opposed sidewall surfaces and respective first and second sacrificial dielectrics, wherein said first spacer is adjacent to said first sacrificial dielectric and said second spacer is adjacent to said second sacrificial dielectric, wherein said first and second sacrificial dielectrics comprise a first dielectric material, wherein said first and second spacers comprise a second dielectric material dissimilar to said first dielectric material, and wherein the upper surfaces of the first and second sidewall spacers are substantially planar; and
    lightly doped drain areas arranged within said semiconductor substrate and beneath said first and second spacers, wherein said lightly doped drain areas are arranged directly below said spacers such that each of said lightly doped drain areas comprises a lateral thickness approximately equal to a lateral thickness of the spacer directly above.

10. The transistor of claim 9, wherein both said first spacer and said second spacer comprise nitride.

11. The transistor of claim 10, wherein both said first sacrificial dielectric and said second sacrificial dielectric comprise oxide.

12. The transistor of claim 10, wherein the first and second spacers comprise nitride deposited from a high density plasma.

13. The transistor of claim 9, wherein an etch rate of the first dielectric material is dissimilar to an etch rate of the second dielectric material.

14. The transistor of claim 9, wherein the upper surfaces of the first and second sidewalls spacers are substantially coplanar with the upper surfaces of the first and second sacrificial dielectrics and with the upper surfaces of the gate conductor.

15. The transistor of claim 9, wherein said first spacer comprises a first lateral thickness, and wherein said second spacer comprises a second lateral thickness, and wherein said first lateral thickness and said second lateral thickness are dissimilar.

16. The transistor of claim 15, wherein said second lateral thickness is greater than said first lateral thickness.

17. The transistor of claim 1, wherein said transistor further comprises a gate oxide arranged directly below said gate conductor.

18. The transistor of claim 17, wherein an upper surface of said gate oxide is above an uppermost surface of said semiconductor substrate.

19. The transistor of claim 5, wherein said transistor further comprises a gate oxide arranged directly below said gate conductor.

20. The transistor of claim 19, wherein an upper surface of said gate oxide is above an uppermost surface of said semiconductor substrate.

21. The transistor of claim 9, wherein said transistor further comprises a gate oxide arranged directly below said gate conductor.

22. The transistor of claim 21, wherein an upper surface of said gate oxide is above an uppermost surface of said semiconductor substrate.

* * * * *